(12) United States Patent
Kahlisch et al.

(10) Patent No.: US 6,724,076 B1
(45) Date of Patent: Apr. 20, 2004

(54) PACKAGE FOR A SEMICONDUCTOR CHIP

(75) Inventors: Knut Kahlisch, Dresden (DE); Volker Strutz, Tegernheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/111,294
(22) PCT Filed: Nov. 14, 2000
(86) PCT No.: PCT/EP00/11254
§ 371 (c)(1),
(2), (4) Date: Jun. 26, 2003
(87) PCT Pub. No.: WO01/37335
PCT Pub. Date: May 25, 2001

(30) Foreign Application Priority Data

Nov. 15, 1999 (DE) .......................... 199 54 888

(51) Int. Cl.$^7$ .............................. H01L 23/02
(52) U.S. Cl. ................. 257/680; 257/667; 257/668; 257/774; 257/737; 257/738
(58) Field of Search ................ 257/680, 774, 257/737, 738, 668, 778, 667

(56) References Cited

U.S. PATENT DOCUMENTS

| 4,644,445 A | 2/1987 | Sakuma |
| 5,148,265 A | 9/1992 | Khandros et al. |
| 5,920,118 A | 7/1999 | Kong |
| 6,126,428 A | 10/2000 | Mitchell et al. |
| 6,333,564 B1 * | 12/2001 | Katoh et al. ................ 257/780 |
| 6,528,408 B2 * | 3/2003 | Kinsman ................... 438/613 |
| 2002/0190366 A1 * | 12/2002 | Hung et al. ................. 257/684 |

FOREIGN PATENT DOCUMENTS

| DE | 94 17 734 | 4/1995 |
| DE | 299 02 754 U 1 | 6/1999 |
| EP | 0 810 655 | 12/1997 |
| JP | 11097569 | 4/1999 |
| WO | WO 99/07014 | 2/1999 |
| WO | WO 00/42648 | 7/2000 |

* cited by examiner

Primary Examiner—Nathan J. Flynn
Assistant Examiner—Pershelle Greene
(74) Attorney, Agent, or Firm—Welsh & Katz, Ltd.

(57) ABSTRACT

The invention relates to a packaging for a semiconductor chip. A frame that directly surrounds the slot is provide on the carrier board on the side of the nubbins. Said frame is provided with the same height as the nubbins and the slot and the frame surrounding said slot are at least partially filled with a casting compound which is preferably adapted to the thermal expansion coefficients of the semiconductor chip.

9 Claims, 2 Drawing Sheets

PACKAGE FOR A SEMICONDUCTOR CHIP

Figure 1:
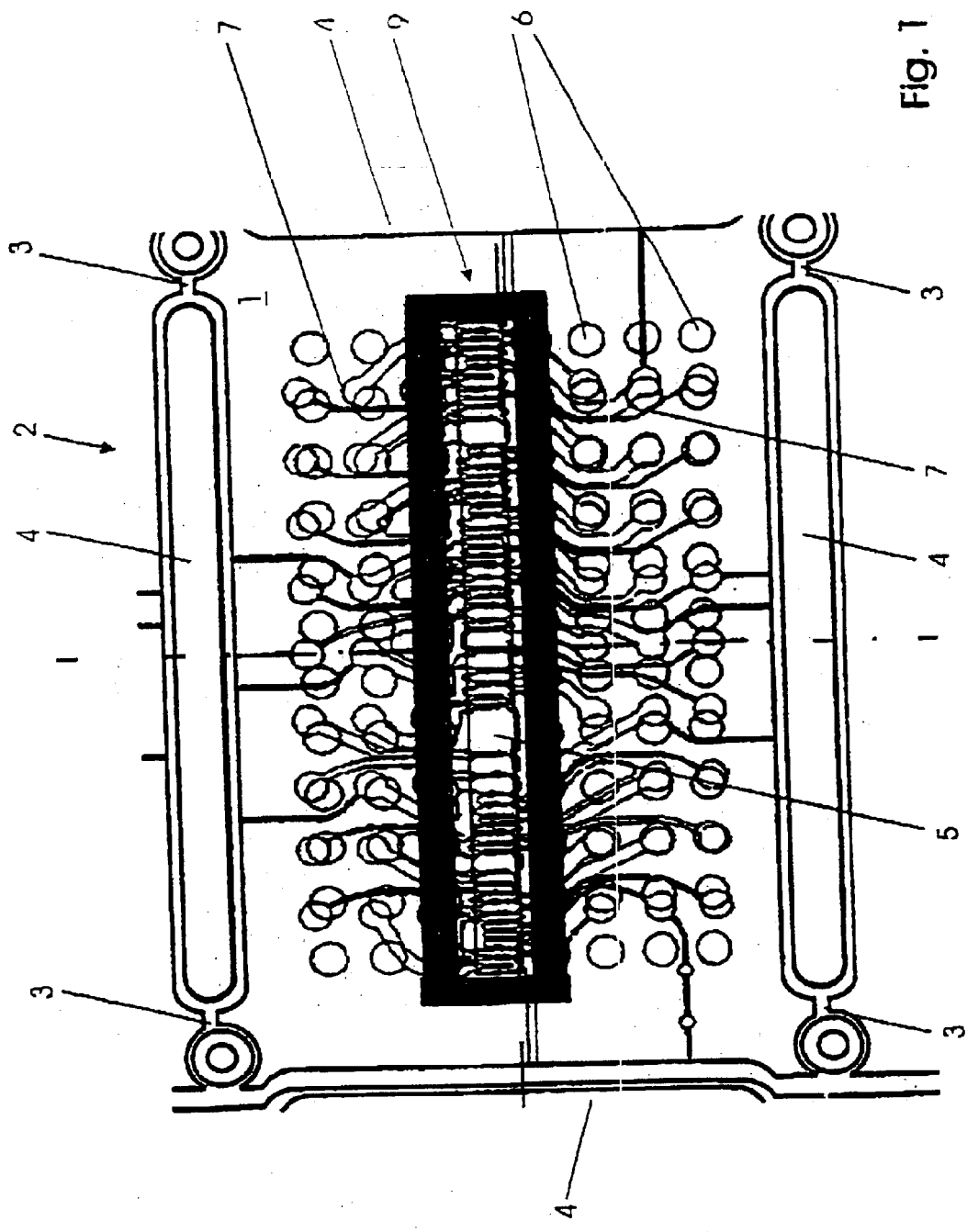

The invention relates to a package for a semiconductor chip, in particular for CSP, μBGA or FBGA packages, with a carrier board made of polyimide, the carrier board having a central slot and being provided on one side with interconnects and a micro-ball grid array and on the other side, next to the slot, with a plurality of rows of nubbins for receiving the semiconductor chip by die bonding, and in which the bonding pads are arranged in a linear central manner on the semiconductor chip and are connected to the interconnects on the carrier board via contact bridges passed through the slot.

Packages of this type, in which the intermediate space between the semiconductor chip and the carrier board is at least partially filled with a silicone, must meet extreme requirements with respect to stress absorption. In particular, thermally induced stresses, induced by different coefficients of expansion (CTE) of individual components of the package, must be prevented, or at least largely compensated.

The structure of a package described at the beginning is largely successful in meeting these requirements, although with the disadvantage of very complex and time-intensive production technology.

Put in a somewhat simplified way, a series of process steps are required, initially beginning with the provision of a suitable carrier board (polyimide frame). To be able to package a relatively large number of semiconductor chips simultaneously, the carrier board is divided into a corresponding number of completely identically structured individual regions.

Each individual region in this case contains on one side the necessary interconnects arid contact pads on the one hand and an adequate number of nubbins (spacers) for receiving a semiconductor chip on the other hand. These nubbins, on which the semiconductor chip is then attached in the further production process by die bonding (adhesive chip bonding), serve for stress absorption and, in particular, for compensating for unavoidable thermal stresses. The interconnects, contact pads and the nubbins are usually applied to the carrier board by printing.

To make it easily possible for the individuals regions to be individually separated, they are surrounded by clearances, which extend virtually over the entire edge length of the individual region in each case and are bounded by predetermined breaking points. Furthermore, each individual region is provided with a central slot, which leaves the bonding pad region of the semiconductor chip free. Consequently, after the die bonding, electrical connections can be established from the bonding pads oh the semiconductor chip to the interconnects on the carrier element by lead bonding or wire bonding. The already mentioned nubbins are arranged on the carrier board in grid form in parallel rows, which extend parallel to the slot.

Since this structure, which is fundamentally similar in the case of CSP, MBGA or FBGA packages, is still relatively sensitive to stress, the mechanical and electrical connection of the components is followed by a closure of all cavities. This applies in particular to the mechanically extremely sensitive region in which the contact bridges are located.

This closure (encapsulation) is usually carried out with a silicone, which must be of very low viscosity. The silicone is filled into the bonding channel with a dispenser and spreads between the semiconductor chip and the carrier element as a result of the capillary action, with the nubbins being encapsulated at the same time. Since the silicone must be of very low viscosity, it would also flow through the clearances between the predetermined breaking points and run downward out of the carrier element. Since it is absolutely necessary to prevent this from happening, it is required to laminate the carrier element on its underside with a thin film in a preparatory step. This film must, on the one hand, be sufficiently thermally stable and, in particular, must be removable without leaving any residue.

The required low-viscosity silicone also has the disadvantage that it is not possible to realize a CTE which is comparable with that of silicon. The reason for this is that, because of the required low viscosity, it is scarcely possible for additives to be admixed.

After the already time-consuming closure, an evacuation of the arrangement in a vacuum chamber must also be performed, known as a vacuum wait. Subsequently, the film then has to be removed again (peeling process step), after which the separation of the individual regions to form individual components can be performed.

The invention is now based on the object of realizing a package for a semiconductor chip which can be produced at lower cost with fewer process steps and with which significantly better stress absorption can be achieved.

The object on which the invention is based is achieved in the case of a package for a semiconductor chip of the type stated at the beginning by providing on the carrier board, on the side of the nubbins, a frame which directly surrounds the slot, is of the same height as the remaining nubbins and has, at least on the chip side, an adhesive bonding edge, and by the slot and the frame surrounding the slot being at least partially filled with a casting compound.

In the case of a carrier board designed in such a way, the silicone is reliably prevented from spreading between the semiconductor chip and the carrier board when it is used for filling the bonding channel. This has the considerable advantage that a series of time-intensive process steps can be saved in the production of the package. These are, in particular, the laminating, vacuum-wait and peeling steps. The frame can simply be positioned on the carrier board instead of the row of nubbins directly alongside the slot.

This may take place in particular by a frame being separately produced and subsequently adhesively bonded to the carrier board. However, a procedure of this type is only meaningful in the case of small numbers of units.

It is of course simpler if, in a way corresponding to a development of the invention, the frame is printed onto the carrier board in the same way as the nubbins, at the same time as them. This allows the production expenditure to be kept to a minimum.

The casting compound may, as usual, comprise silicone, although it is now possible if need be to use silicone of high or low viscosity. The use of particularly low-viscosity silicone is unproblematical, since the frame ensures adequate sealing of the bonding channel.

On the other hand, the coefficient of thermal expansion of the casting compound can be adapted very well to the coefficient of thermal expansion of the semiconductor chip as a consequence of the shaping of the miniature package according to the invention. The in this case higher-viscosity casting compound, with poor flowing properties, simply has to be filled into the bonding channel, with the result that it is no longer necessary to utilize the capillary action during the filling process. The filling of the casting compound into the bonding channel can be performed with a customary dispenser.

The adaptation of the coefficient of expansion of the casting compound to the coefficient of expansion of the semiconductor chip can be performed in a simple way by an adequate proportion of Si particles being admixed with the casting compound.

It Is also possible for a glob top, with in fact poor flow properties, to be used as the casting compound.

The filling height of the casting compound in the bonding channel, which is formed after the die bonding and is bounded by the slot and the frame on the one hand and by the bonded semiconductor chip on the other hand, is advantageously to be chosen to be high enough that at least the contact bridges are completely enclosed by the casting compound.

Since the bonding channel is completely sealed with respect to the remaining regions of the miniature housing, and consequently no quantitative loss occurs, the filling height of the casting compound can be determined by prescribing the filling amount during dispensing.

Figure 2:
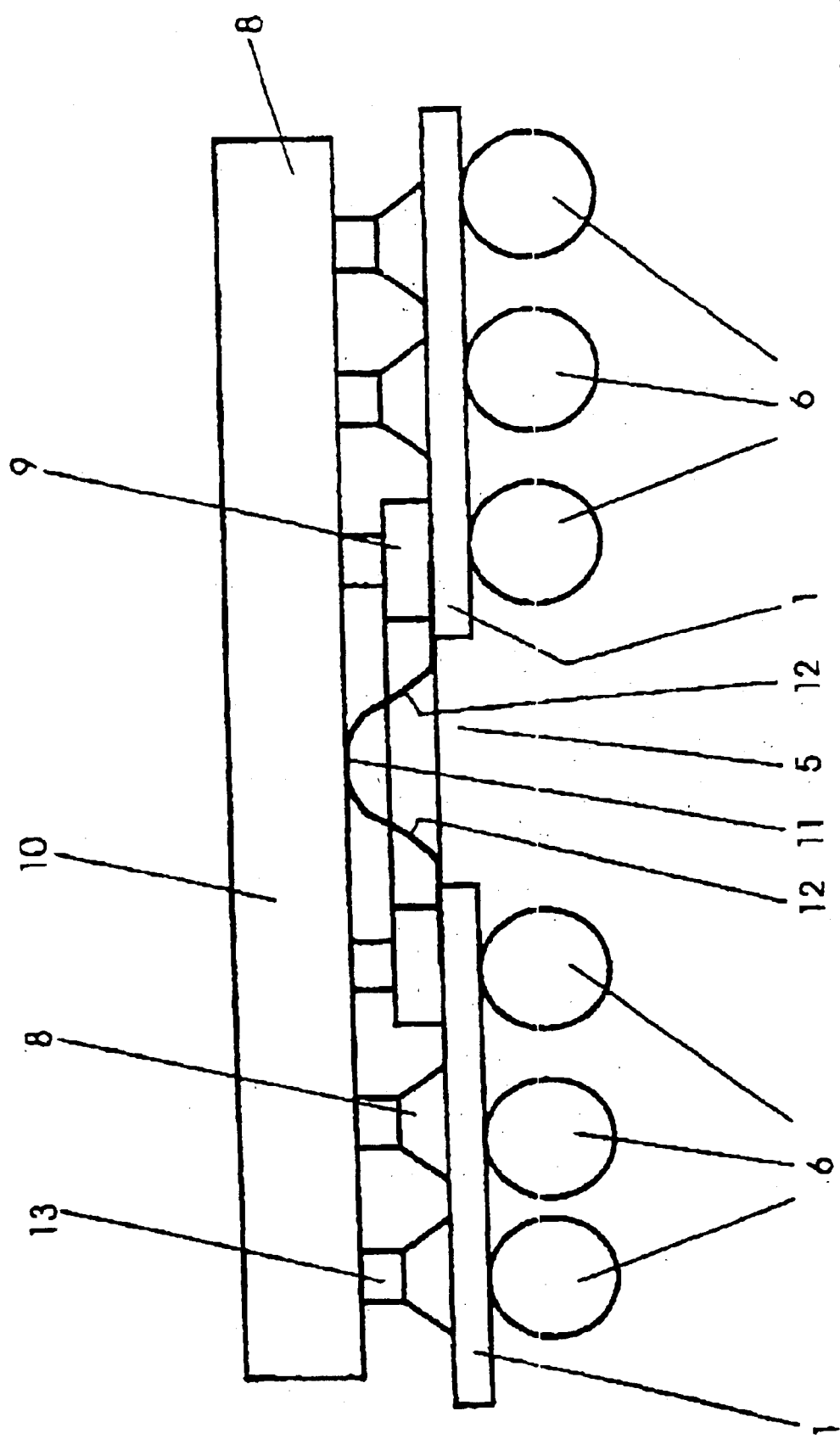

The invention is to be explained in more detail below on the basis of an exemplary embodiment. In the associated figures of the drawing:

FIG. 1 shows a plan view of a schematic representation of a carrier board provided with a frame; and FIG. 2 shows a schematic sectional representation of the package for a semiconductor chip.

The carrier board 1 which can be seen from FIG. 1 represents a detail with an individual region 2, the mutually neighboring individual regions 2 being bounded from one another by predetermined breaking points 3 and slits 4. The predetermined breaking points 3 in conjunction with the slits 4 allow the packages to be separated into the individual regions 2 in a simple way after completion, for example by punching.

Each individual region 2 has a central slot 5 and is provided on one side with interconnects 7 and landing pads for the micro-ball grid array 6 to be produced later, which reach up as far as the slot 5.

The micro-ball grid array 6 serves for the electrical and mechanical contacting of the complete arrangement on a printed circuit board (not represented).

Furthermore, located on the side of the carrier board 1 opposite from that of the micro-ball grid array 6 are so-called nubbins 8 (or spacers), which are arranged in parallel rows next to the slot 5 (FIG. 2). These nubbins 8 usually consist of silicone. Furthermore, a frame 9, which surrounds the slot 5, is provided. The frame 9 likewise consists of silicone and is in this case designed such that its height exactly corresponds to the height of the nubbins 8. This makes it possible to attach a semiconductor chip 10 on the nubbins 8 and at the same time on the frame 9 by die bonding. The attachment of the semiconductor chip 10 with adhesive 13 is performed in this case with the active side on the nubbins 8 and the frame 9 (that is to say face down), the semiconductor chips 10 having to be provided with a central row of bonding pads 11.

The electrical connection of the bonding pads 11 and the interconnects 7 on the carrier board 1 with contact bridges 12 can be performed as usual by lead or wire bonding.

Once the electrical connection has been established, the filling of the bonding channel, which is bounded by the slot 5 and the frame 9 on the one hand and the semiconductor chip 10 on the other hand, can be performed in a final step. The filling height of the casting compound is in this case to be chosen to be at least high enough that at least the contact bridges 12 are completely enclosed by the casting compound. The filling height of the casting compound can be determined in a simple way by prescribing the filling amount during dispensing. This is possible as a result of the frame 9 achieving complete sealing of the bonding channel, reliably preventing the casting compound from penetrating into the intermediate space between the semiconductor chip 10 and the carrier board 1, so that no quantitative loss can occur.

The casting compound can, as usual, consist of silicone, and be of high or low viscosity. It is particularly advantageous that, as a consequence of the frame 9 surrounding the slot 5, it continues to be possible to adapt the coefficient of thermal expansion of the casting compound to the coefficient of thermal expansion of the semiconductor chip 10. This can be performed in a simple way by admixing a high proportion of Si particles with the casting compound. The casting compound may be relatively viscous, since all that matters is to fill the bonding channel and that no capillary action has to be utilized.

What is claimed is:

1. A package for a semiconductor chip, in particular for CSP, µBGA or FBGA packages, with a carrier board made of polyimide, the carrier board having a central slot and being provided on one side with interconnects and a micro-ball grid array and on the other side, next to the slot, with a plurality of rows of nubbins for receiving the semiconductor chip by die bonding, and in which the bonding pads are arranged in a linear central manner on the semiconductor chip and are connected to the interconnects on the carrier board via contact bridges passed through the slot, characterized in that provided on the carrier board (1), on the side of the nubbins (8), is a frame (9) which directly surrounds the slot (5), is of the same height as the nubbins (8) and has, at least on the chip side, an adhesive bonding edge, and in that the slot (5) and the frame (9) surrounding the latter are at least partially filled with a casting compound.

2. The package as claimed in claim 1, characterized in that the frame (9) is adhesively bonded to the carrier board (1).

3. The package as claimed in claim 1, characterized in that the frame (9) is printed onto the carrier board in the same way as the nubbins (8).

4. The package as claimed in claim 1, characterized in that the casting compound consists of silicone.

5. The package as claimed in claim 4, characterized in that the coefficient of thermal expansion of the casting compound is adapted to the coefficient of thermal expansion of the semiconductor chip (10).

6. The package as claimed in claim 5, characterized in that the casting compound contains a high proportion of Si particles.

7. The package as claimed in claim 1 characterized in that the casting compound is formed as a glob top.

8. The package as claimed in claim 1, characterized in that the filing height of the casting compound is the bonding channel, which forced after die bonding and is bounded by slot and the frame on the one hand any the bonded semiconductor chip on the other hand, is chosen to be high enough that at least the contact bridges are completely enclosed by the casting compound.

9. The package as claimed in claim 8, characterized in that the filling height of the casting compound is determined by prescribing the filling amount during dispensing.

* * * * *